US011004856B1

(12) United States Patent
Zhang et al.

(10) Patent No.: US 11,004,856 B1
(45) Date of Patent: May 11, 2021

(54) STACKED VERTICAL TRANSISTOR MEMORY CELL WITH EPI CONNECTIONS

(71) Applicant: INTERNATIONAL BUSINESS MACHINES CORPORATION, Armonk, NY (US)

(72) Inventors: Chen Zhang, Albany, NY (US); Tenko Yamashita, Schenectady, NY (US); Kangguo Cheng, Schenectady, NY (US); Heng Wu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/680,965

(22) Filed: Nov. 12, 2019

(51) Int. Cl.
*H01L 27/11* (2006.01)
*H01L 27/06* (2006.01)
*H01L 27/092* (2006.01)
*H01L 23/528* (2006.01)
*H01L 29/08* (2006.01)
*H01L 21/8238* (2006.01)
*H01L 29/78* (2006.01)
*H01L 21/822* (2006.01)

(52) U.S. Cl.
CPC ...... *H01L 27/1104* (2013.01); *H01L 21/8221* (2013.01); *H01L 21/823814* (2013.01); *H01L 21/823871* (2013.01); *H01L 21/823885* (2013.01); *H01L 23/5286* (2013.01); *H01L 27/0688* (2013.01); *H01L 27/0922* (2013.01); *H01L 29/0847* (2013.01); *H01L 29/7827* (2013.01); *H01L 29/7841* (2013.01)

(58) Field of Classification Search
CPC ............. H01L 27/1104; H01L 27/0688; H01L 21/823871; H01L 21/823814; H01L 27/0922; H01L 29/7841; H01L 21/823885; H01L 23/5286; H01L 29/7827; H01L 21/8221; H01L 29/0847
See application file for complete search history.

(56) References Cited

U.S. PATENT DOCUMENTS

| 7,683,428 | B2 | 3/2010 | Chidambarrao et al. |
| 9,177,890 | B2 | 11/2015 | Du |
| 9,299,641 | B2 * | 3/2016 | Sekar .................... H01L 27/092 |
| 9,613,887 | B2 * | 4/2017 | Sekar .................... H01L 27/092 |
| 9,620,509 | B1 | 4/2017 | Pao et al. |
| 9,659,963 | B2 | 5/2017 | Cheng et al. |
| 9,825,032 | B1 | 11/2017 | Bentley et al. |
| 9,997,413 | B1 | 6/2018 | Leobandung |
| 10,109,637 | B1 | 10/2018 | Zang et al. |
| 10,217,674 | B1 | 2/2019 | Hook et al. |

(Continued)

*Primary Examiner* — John P. Dulka
(74) *Attorney, Agent, or Firm* — Tutunjian & Bitetto, P.C.; Robert Sullivan

(57) ABSTRACT

A semiconductor device includes a stacked transistor memory cell. The stacked transistor memory cell includes a bottom tier including a plurality of bottom transistors including at least one non-floating transistor and at least one floating transistor. The at least one floating transistor has at least one terminal being electrically disconnected from other transistors of the stacked transistor memory cell. The stacked transistor memory cell further includes a top tier including a at least one top transistor, and a cross-coupling including epitaxial region (epi) connections and gate to epi connections between the top tier and the bottom tier.

20 Claims, 10 Drawing Sheets

(56) References Cited

U.S. PATENT DOCUMENTS

| | | | |
|---|---|---|---|
| 10,600,763 B1* | 3/2020 | Xiao | H01L 24/80 |
| 2005/0248035 A1* | 11/2005 | Son | H01L 21/823425 |
| | | | 257/758 |
| 2006/0234487 A1* | 10/2006 | Kim | H01L 21/76898 |
| | | | 438/597 |
| 2006/0237725 A1* | 10/2006 | Jeong | H01L 29/78 |
| | | | 257/66 |
| 2007/0181953 A1* | 8/2007 | Lyu | H01L 27/1108 |
| | | | 257/382 |
| 2014/0061805 A1* | 3/2014 | Won | H01L 29/78 |
| | | | 257/368 |
| 2015/0311142 A1* | 10/2015 | Sekar | H01L 21/823475 |
| | | | 257/499 |
| 2015/0318288 A1 | 11/2015 | Lim et al. | |
| 2015/0349068 A1* | 12/2015 | Levesque | H01L 21/28525 |
| | | | 257/741 |
| 2016/0043074 A1 | 2/2016 | Hurley et al. | |
| 2016/0133638 A1* | 5/2016 | Simsek-Ege | H01L 27/11556 |
| | | | 257/314 |
| 2017/0018464 A1* | 1/2017 | Kim | H01L 21/823821 |
| 2019/0081069 A1* | 3/2019 | Lu | H01L 27/1157 |
| 2019/0088589 A1* | 3/2019 | Zhu | H01L 25/18 |
| 2020/0105596 A1* | 4/2020 | Lo | H01L 21/32 |
| 2020/0111798 A1* | 4/2020 | Paul | H01L 21/76805 |
| 2020/0194452 A1* | 6/2020 | Xiao | H01L 21/76877 |
| 2020/0312839 A1* | 10/2020 | Majhi | H01L 21/02667 |
| 2020/0328209 A1* | 10/2020 | Zhang | H01L 21/823885 |
| 2020/0343349 A1* | 10/2020 | Hung | H01L 21/28518 |

* cited by examiner

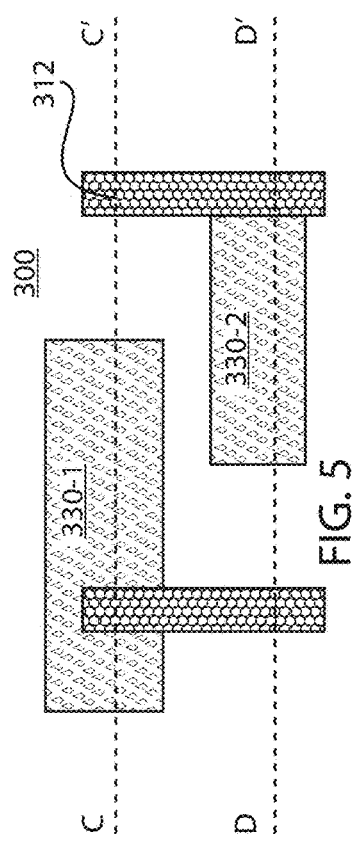
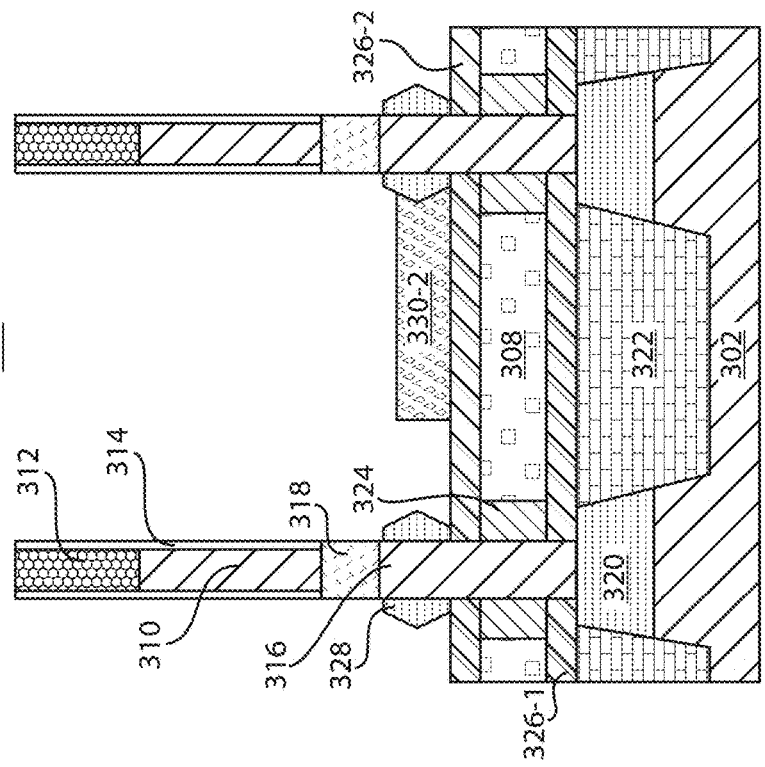
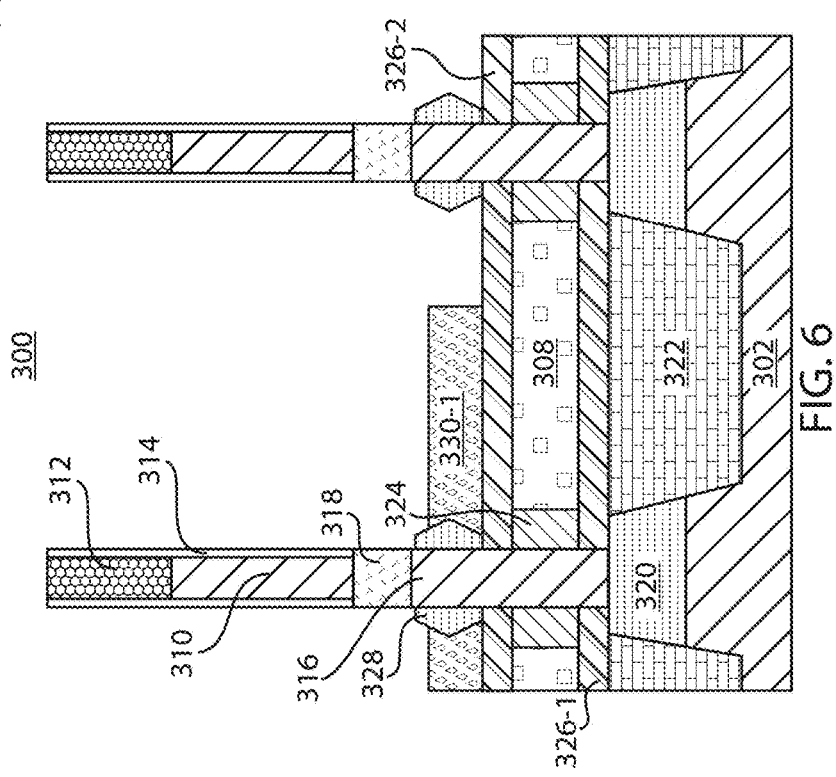

US 11,004,856 B1

STACKED VERTICAL TRANSISTOR MEMORY CELL WITH EPI CONNECTIONS

BACKGROUND

The present invention generally relates to semiconductor devices, and more particularly to stacked vertical transistor memory cells and methods of forming the same.

Vertical transistors, such as vertical field-effect transistors (FETs), have been devised as a way to reduce contact poly pitch (CPP) to decrease unit cell size and increase efficiency by orienting current flow vertically. Further, since the ohmic contacts and the channels are aligned vertically, contact density per unit of surface area of a vertical transistor is higher than in a lateral transistor.

SUMMARY

In accordance with an embodiment of the present invention, a semiconductor device is provided. The device includes a stacked transistor memory cell. The stacked transistor memory cell includes a bottom tier including a plurality of bottom transistors including at least one non-floating transistor and at least one floating transistor. The at least one floating transistor has at least one terminal being electrically disconnected from other transistors of the stacked transistor memory cell. The stacked transistor memory cell further includes a top tier including a at least one top transistor, and a cross-coupling including epitaxial region (epi) connections and gate to epi connections between the top tier and the bottom tier.

In accordance with another embodiment of the present invention, a semiconductor device is provided. The device includes a stacked vertical transistor memory cell. The stacked vertical transistor memory cell includes a bottom tier including a plurality of bottom vertical transistors including n-type field-effect transistors (nFETs) having a merged top source/drain epitaxial region (epi), and gate structures. The plurality of bottom vertical transistors include first and second non-floating transistors and first and second floating transistors. The first and second floating transistors have at least one terminal being electrically disconnected from other transistors of the stacked vertical transistor memory cell. The stacked vertical transistor memory cell further includes a top tier including a plurality of top vertical transistors including p-type field-effect transistors (pFETs) having a merged bottom source/drain epi, and gate structures. The plurality of top vertical transistors including first, second, third and fourth top vertical transistors. The stacked vertical transistor memory cell further includes a cross-coupling contacting the gate structures of the bottom and top tiers. The cross-coupling includes epi connections by the merged top source/drain epi between the first non-floating and floating transistors, and the second non-floating and floating transistors, epi connections by the merged bottom source/drain epi between the first and third top vertical transistors, and the second and fourth top vertical transistors, gate to epi connections by metal between the first non-floating and second floating transistors, and the second non-floating and first floating transistors, and gate to epi connections by metal between the first and second top vertical transistors, and the third and fourth top vertical transistors.

In accordance with yet another embodiment of the present invention, a method for fabricating a semiconductor device is provided. The method includes forming a stacked transistor memory cell including a bottom tier having a plurality of bottom transistors including at least one non-floating transistor and at least one floating transistor and a top tier having at least one top transistor. The at least one floating transistor has at least one terminal being electrically disconnected from other transistors of the stacked vertical transistor memory cell. Forming the stacked transistor memory cell includes forming a cross-coupling including epitaxial region (epi) connections and gate to epi connections between the top tier and the bottom tier.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 5 is a top-down view of sacrificial layers etched during the fabrication of a semiconductor device, in accordance with an embodiment of the present invention;

FIG. 6 is a cross-sectional view of the semiconductor device shown in FIG. 5, in accordance with an embodiment of the present invention;

FIG. 7 is another cross-sectional view of the semiconductor device shown in FIG. 5, in accordance with an embodiment of the present invention;

DETAILED DESCRIPTION

Figure 1:
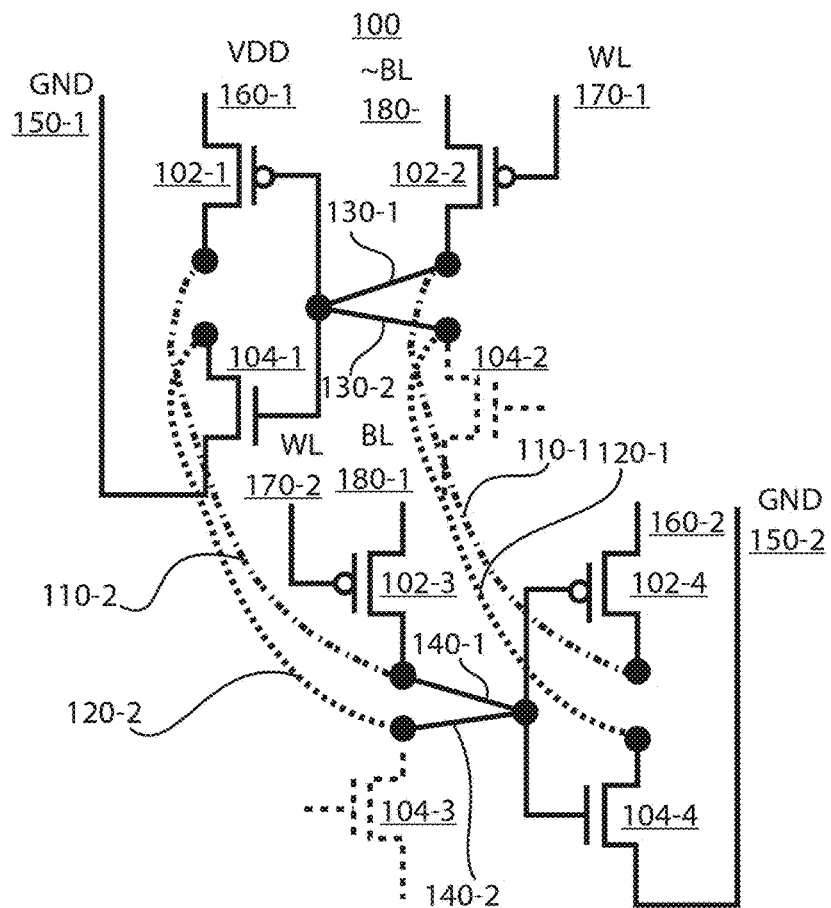
FIG. 1 is a schematic diagram of a memory cell, in accordance with an embodiment of the present invention.

The embodiments described herein provide for a stacked transistor memory cell in a stacked three-dimensional (3D) transistor architecture. The stacked transistor memory cell can include floating and non-floating transistors. As used herein, a floating transistor of a memory cell is a transistor that has at least one terminal (e.g., at least one of a source/drain, drain/source and gate) being electrically disconnected or isolated from other transistors of the memory cell, and none of the terminals represent an interface of the memory cell to the outside (e.g., wordline (WL), bitline (BL), supply voltage (VDD) and ground (GND)). A non-floating transistor of a memory cell is a transistor that is not a floating transistor. That is, each of the terminals of a non-floating transistor either connects to other transistors in the memory cell, or represents an interface of the memory cell to the outside.

The stacked transistor memory cell formed in accordance with the embodiments described herein includes a top tier and a bottom tier each having respective transistors. The top tier can illustratively include p-type transistors (e.g., pFETs) and the bottom tier can include n-type transistors (e.g., nFETs). For example, a top tier transistor (e.g., pFET) can be used as a pass-gate.

In one embodiment, the stacked transistor memory cell is a stacked vertical transistor memory cell. More specifically, the stacked vertical transistor memory cell can include vertical transport FETs (VTFETs). A merged bottom epitaxial region ("epi") in the top tier can be used to connect the pass gate to a first inverter (e.g., pFET) drain. The transistor directly below the pass gate (e.g., nFET) can include a floating gate and a bottom source/drain, and can have its top epi merged to the top of the epi (drain) of a second inverter (e.g., nFET). A cross-couple contact can connect the gates of an inverter, which can directly contact the pass gate bottom epi and the floating transistor top epi.

In accordance with aspects of the present invention, the integration of the stacked transistor memory cell within the 3D monolithic scheme provides a variety of benefits, such as with respect to logic. For example, one or more of the following benefits can be realized: (1) tighter packing of circuits so that back-end-of-the-line (BEOL) wire length is reduced for power and performance benefit; and (2) higher drive strength in a given areal footprint.

Exemplary applications/uses to which the present invention can be applied include, but are not limited to, fabricating memory devices. For example, embodiments of the present invention can be applied to the fabrication of a static random-access memory (SRAM) device formed from SRAM cells. As is known in the art, an SRAM cell is composed of transistors, which can include metal-oxide-semiconductor FETs (MOSFETs). For example, in a six transistor SRAM cell (i.e., a 6T SRAM cell), each bit is stored on four transistors that form cross-coupled inverters, and the other two transistors are access transistors that control access to a storage cell during read and write operations. In the 6T SRAM cell embodiment discussed herein, the top tier can include four p-type transistors, and the bottom tier can include two n-type transistors. For example, the top tier could can include two pass-gates. However, such embodiments are not limiting. For example, in an alternative embodiment, the top tier can include n-type transistors and the bottom tier can include n-type transistors.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which can include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a schematic diagram of a memory cell 100 is provided.

The memory cell 100 includes a stacked transistor memory cell having a plurality of transistors. In an illustrative embodiment, the memory cell 100 includes a stacked vertical transistor memory cell having a plurality of vertical transistors.

The memory cell 100 can include floating and non-floating transistors. The floating transistors can have at least one terminal (e.g., at least one of a source/drain, drain/source and gate) being electrically disconnected from other ones of the transistors. For example, as shown, the memory cell 100 includes eight transistors, including a set of transistors 102-1 through 102-4 and a set of transistors 104-1 through 104-4. In this illustrative embodiment, the plurality of transistors can include field-effect transistors (FETs). In one embodiment, the set of transistors 102-1 through 102-4 include p-type FETs (pFETs) and the set of transistors 104-1 through 104-4 include n-type FETs (nFETS). However, such an embodiment should not be considered limiting. Transistors 140-2 and 140-3, which are indicated by a dashed line, correspond to floating transistors (e.g., floating nFETs).

As further shown, a plurality of connections between respective ones of the plurality of transistors is shown. More specifically, a cross-coupling is realized by epitaxial region ("epi") connections and gate-to-epi connections.

More specifically, the dash-dot line 110-1 corresponds to a merged bottom epi connection between a source/drain of the transistor 102-2 and a source/drain of the transistor 102-4 and the dash-dot line 110-2 corresponds to a merged bottom epi connection between a source/drain of the transistor 102-1 and a source/drain of the transistor 102-3 (e.g., merged pFET bottom epi connections).

The pure dotted line 120-1 corresponds to a merged top epi connection between a drain/source of the transistor 104-2 and a drain/source of the transistor 104-4 and the pure dotted line 120-2 corresponds to a merged top epi connection between a drain/source of the transistor 104-1 and a drain/source of the transistor 104-3 (e.g., merged nFET top epi connections).

The solid line 130-1 corresponds to a gate-epi connection by metal between the source/drain of the transistor 102-2 to the gates of the transistors 102-1 and 104-1, the solid line 130-2 corresponds to a gate-epi connection by metal between the drain/source of the transistor 104-2 and the gate of the transistors 102-1 and 104-1, the solid line 140-1 corresponds to a gate-epi connection by metal between the source/drain of the transistor 102-3 and the gate of the transistors 102-4 and 104-4, and the solid line 140-2 correspond to a gate-to-epi connection by metal between the drain/source of the transistor 104-3.

As further shown, the memory cell 100 includes a plurality of lines. More specifically, a ground (GND) line 150-1 is coupled to a source/drain of the transistor 104-1 and a GND line 150-2 is coupled to a source/drain of the transistor 104-4. A supply voltage (VDD) line 160-1 is coupled to a drain/source of the transistor 102-1 and a VDD line 160-2 is coupled to a drain/source of the transistor 102-4. A wordline (WL) line 170-1 is coupled to the gate of the transistor 102-2 and a WL line 170-2 is coupled to the gate of the transistor 102-3. A bitline (BL) line 180-1 is coupled to a drain/source of the transistor 102-3 and a complementary bitline (~BL) line 180-2 is coupled to a drain/source of the transistor 102-2.

Figure 2:
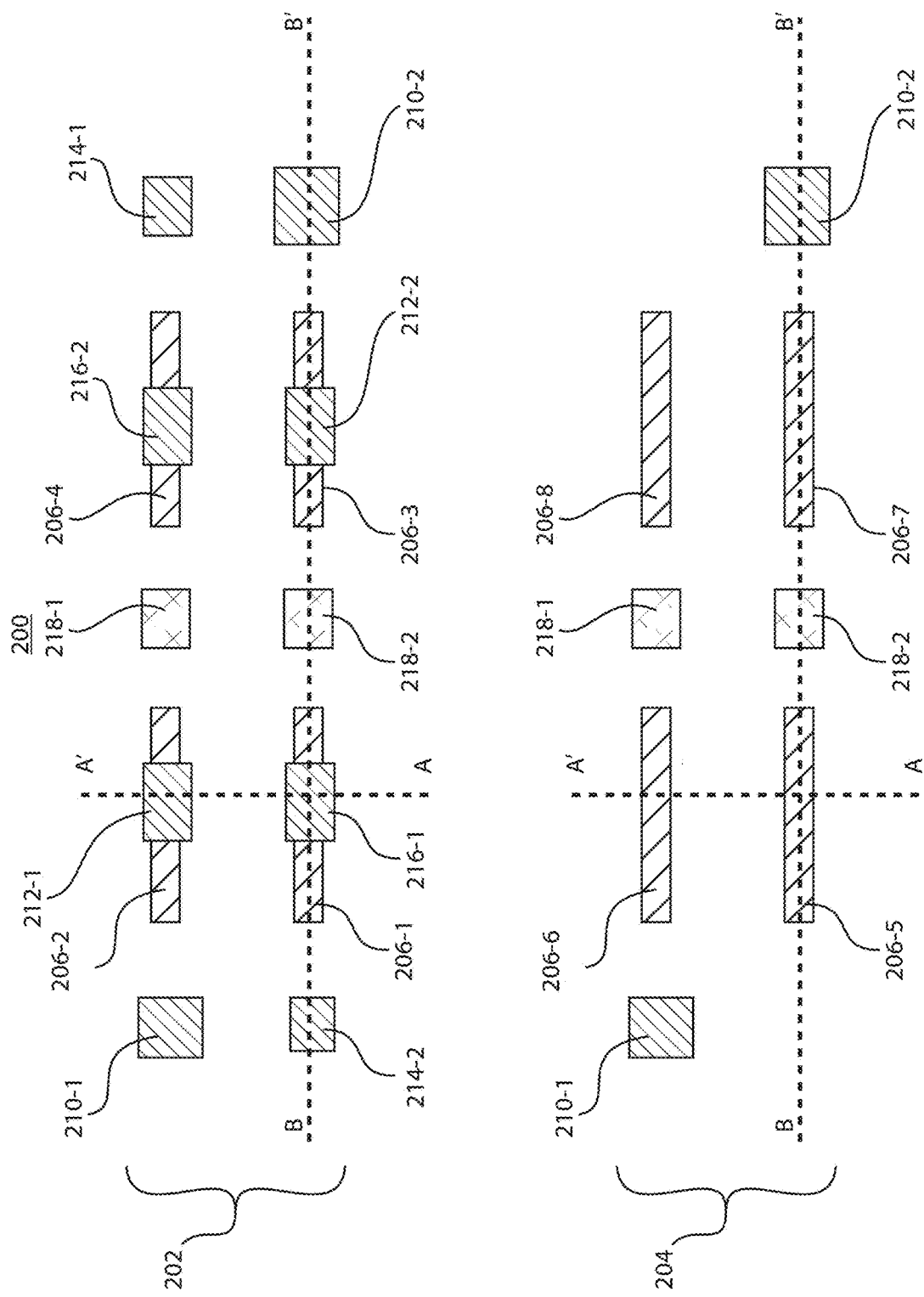
FIG. 2 is a top-down view of a stacked vertical transistor memory cell, in accordance with an embodiment of the present invention.

With reference to FIG. 2, a top-down view of a stacked transistor memory cell 200 having an upper tier 202 and a lower tier 204 is provided. In this illustrative example, the memory cell 200 is a stacked vertical transistor memory cell including eight transistors (e.g., FETs), although the number of transistor should not be considered limiting. The memory cell 200 can represent the memory cell 100 of FIG. 1. For the sake of simplicity, some components of the memory cell 200 (e.g., gate material, top and bottom epitaxial regions ("epis"), and sacrificial layers for making contact) are not shown in FIG. 2.

The memory cell 200 can include floating and non-floating transistors. The floating transistors can have at least one terminal (e.g., at least one of a source/drain, drain/source and gate) being electrically disconnected from other ones of the transistors.

For example, as shown, the memory cell 200 can include a plurality of fins corresponding to the plurality of transistors, including fins 206-2 through 206-8. The plurality of fins can include any suitable material in accordance with the embodiments described herein.

As further shown, the memory cell 200 can include a plurality of contacts, including GND contacts 210-1 and 210-2, VDD contacts 212-1 and 212-2, WL contacts 214-1 and 214-2, BL contact 216-1 and ~BL contact 216-2. As further shown, the memory cell 200 can include cross-couple connections 218-1 and 218-2. As discussed above with reference to FIG. 1, the cross-couple connections can result epi connections and gate-to-epi connections by metal between the plurality of transistors. Cross-sectional views of the memory cell 200 through line A-A' and line B-B' will be described below with reference to FIGS. 3 and 4, respectively.

Figure 3:
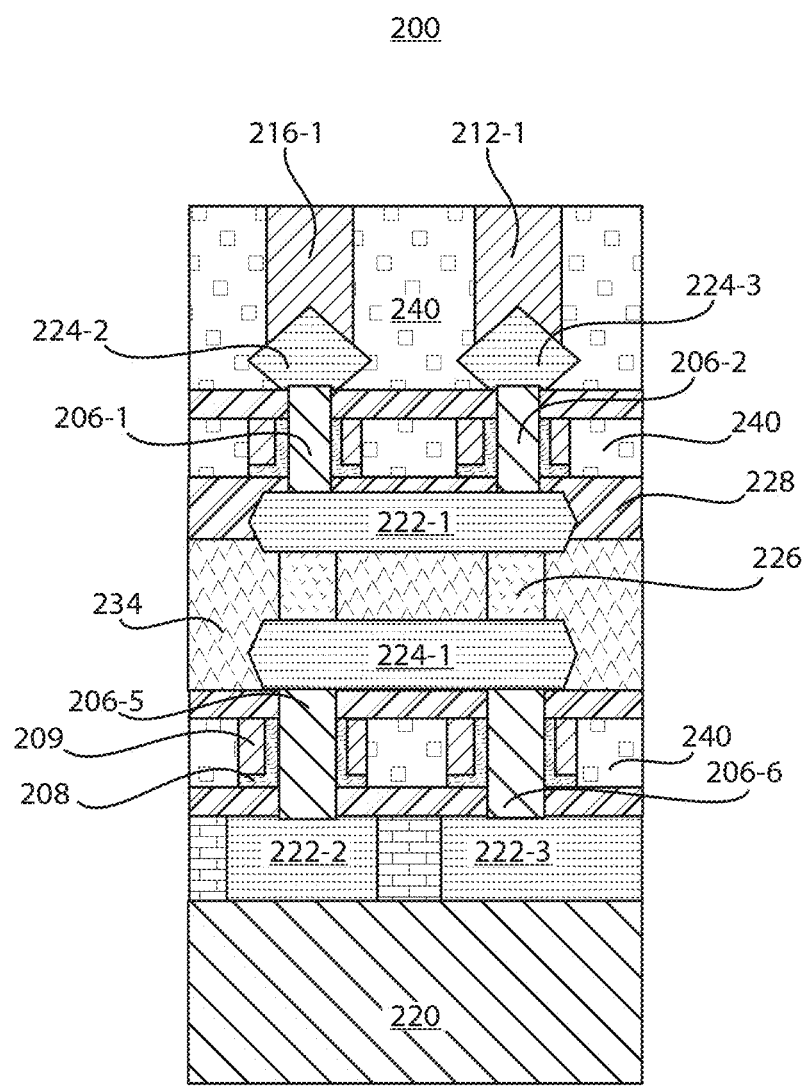
FIG. 3 is a cross-sectional view of the memory cell of FIG. 2, in accordance with an embodiment of the present invention.
Figure 4:
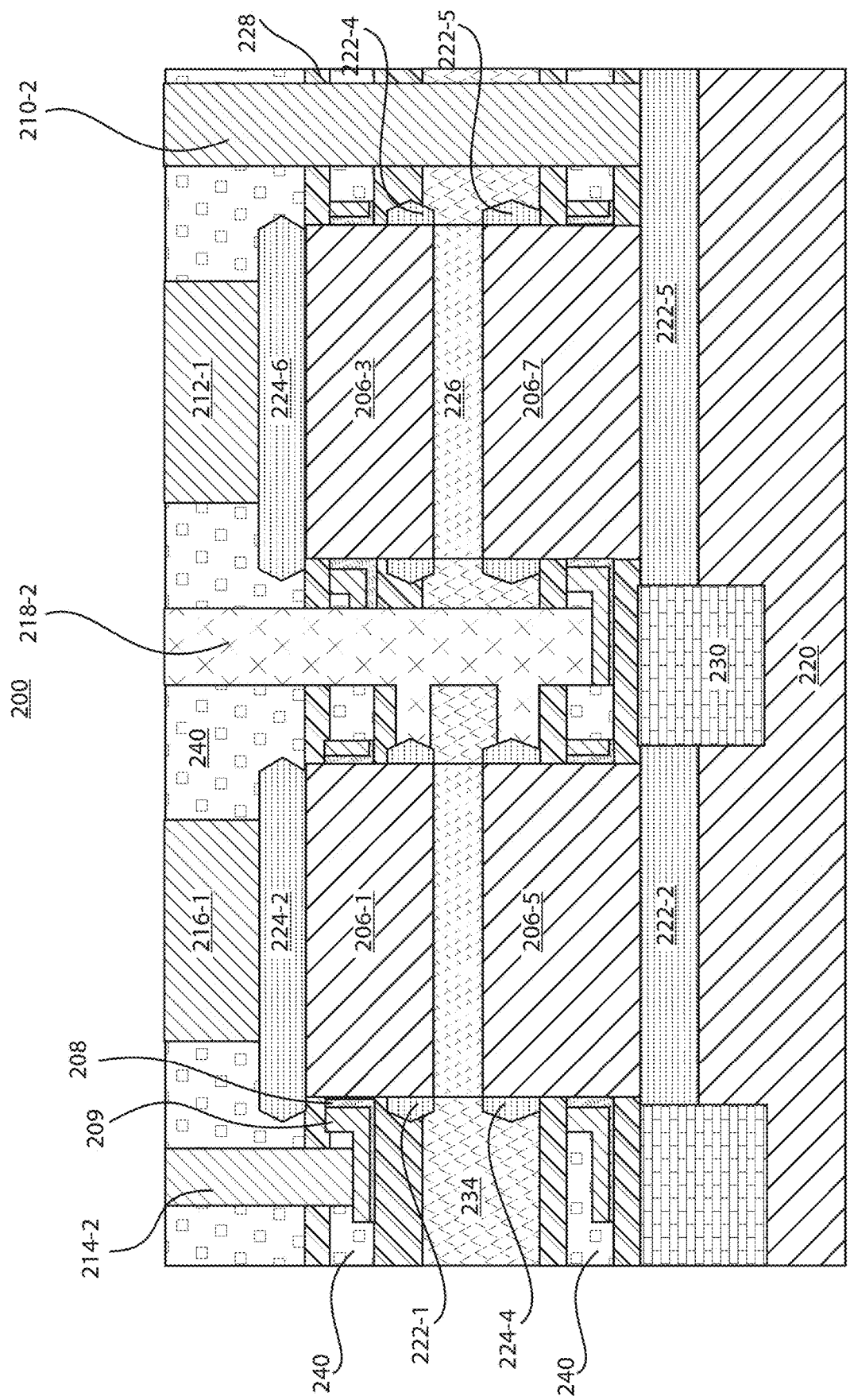
FIG. 4 is another cross-sectional view of the memory cell of FIG. 2, in accordance with an embodiment of the present invention.

With reference to FIGS. 3 and 4, cross-sectional views of the memory cell 200 of FIGS. 2 and 3 are provided. More specifically, FIG. 3 depicts a cross-sectional view through line A-A' of FIG. 2, and FIG. 4 depicts a cross-sectional view through line B-B' of FIG. 2.

As shown, the memory cell 200 includes a substrate 220 having multiple layers formed thereon. The substrate 220 can include any suitable substrate structure, e.g., a bulk semiconductor, a semiconductor-on-insulator (SOI) substrate, etc. In one example, the substrate 220 can include a silicon-containing material. Illustrative examples of Si-containing materials suitable for the substrate 220 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

The memory cell 200 further includes fins 206-1 through 206-3 and 206-5 through 206-7, VDD line 212-1 and BL line 216-1, as described above with reference to FIG. 2. The fins 206-5 through 206-7 correspond to bottom FETs, and the fins 206-1 through 206-3 correspond to top FETs. Each of the FETs can further include a gate dielectric 208 and a gate conductor 209. The gate dielectrics 208 and the gate conductors 209 can include any suitable materials in accordance with the embodiments described herein.

For example, the gate dielectrics 208 can include a high-k dielectric material. As used herein, "high-k" denotes a dielectric material featuring a dielectric constant (k) greater than the dielectric constant of $SiO_2$ at room temperature (20° C.-25° C.) and atmospheric pressure (1 atm). In one embodiment, gate dielectrics 208 can include a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the at gate dielectrics 208 include hafnium silicate, hafnium silicon oxynitride or combinations thereof.

Examples of suitable conductive materials for the gate conductors 209 include, but not limited to metals, metal alloys, metal nitrides and metal silicides, as well as laminates thereof and composites thereof. In one embodiment, the gate conductors 209 can include any conductive metal including, but not limited to W, Ni, Ti, Mo, Ta, Cu, Pt, Ag, Au, Ru, Ir, Rh, and Re, and alloys that include at least one of the aforementioned conductive elemental metals. The gate conductors 209 can also include doped polysilicon and/or polysilicon-germanium alloy materials (i.e., having a dopant concentration from $1 \times 10^{18}$ dopant atoms per cubic centimeter to $1 \times 10^{22}$ dopant atoms per cubic centimeter) and polycide materials (doped polysilicon/metal silicide stack materials). For example, the gate conductors 209 can include a work-function metal (WFM).

In one embodiment, the gate dielectrics 208 and/or the gate conductors 209 can be deposited by chemical vapor deposition (CVD). Variations of CVD processes suitable for depositing the at least one gate dielectric layer include, but are not limited to, APCVD, LPCVD, PECVD, MOCVD, ALD, and combinations thereof.

The memory cell 200 further includes bottom epitaxial ("epi") regions 222-1 through 222-5 corresponding to bottom source/drain regions. More specifically, the memory cell 200 includes a merged bottom epi region 222-1 of the FETs corresponding to fins 206-1 and 206-2, and bottom epi regions 222-2 through 222-5 of the FETs corresponding to fins 206-5, 206-6, 206-3 and 206-7, respectively.

The memory cell 200 further includes top epi regions 224-1 through 224-6 corresponding tot top source/drain regions. More specifically, the memory cell 200 includes a merged top epi region 224-1 of the FETS corresponding to fins 206-5 and 206-6, and top epi regions 224-2 through 224-6 of the FETs corresponding to fins 206-1, 206-2, 206-5, 206-3 and 206-7, respectively.

The epi region 222-1 through 222-5 and 224-1 through 224-6 can include any suitable materials in accordance with the embodiments described herein.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

Source/drain epitaxy can be done by ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE). Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium (SiGe), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from about $1\times10^{19}$ cm$^{-3}$ to about $2\times10^{21}$ cm$^{-3}$, or preferably between $2\times10^{20}$ cm$^{-3}$ and $1\times10^{21}$ cm$^{-3}$. When Si:C is epitaxially grown, the Si:C layer may include carbon in the range of 0.2 to 3.0%. When SiGe is epitaxially grown, the SiGe may have germanium content in the range of 5% to 80%, or preferably between 20% and 60%.

The memory cell 200 further includes dielectric layers 226 isolating pairs of the top and bottom FETs. The dielectric layers 226 can include any suitable material in accordance with the embodiments described herein (e.g., SiO$_2$).

The memory cell 200 further includes a plurality of spacer layers 228. The plurality of spacer layers 228 can include any suitable spacer material in accordance with the embodiments described herein.

The memory cell 200 further includes shallow trench isolation (STI) regions 230 and interlayer dielectric (ILD) layers 240. The STI regions 230 and ILD layers 240 can include any suitable dielectric materials in accordance with the embodiments described herein.

The memory cell 200 further includes an insulator layer 234 providing N-P isolation. The insulator layer 234 can include any suitable material in accordance with the embodiments described herein. For example, the insulator layer 234 can include, e.g., a nitride material.

The memory cell 200 further includes GND contact 210-2, VDD contact 212-1, WL contact 214-2, BL contact 216-1 2, and cross-couple connections 218-2.

The FET corresponding to the fin 206-1 can correspond to a pass-gate FET, the FETs corresponding to the fins 206-2 and 206-6 can correspond to an inverter, and the FET corresponding to the fin 206-5 can correspond to a non-connected floating FET. Thus, the merged bottom epi region 222-1 can be used to contact the pass-gate FET to the inverter FET, the merged top epi region 224-3 can aid with the cross-couple, and the isolated bottom epi region 222-3 can correspond to inverter ground.

FIGS. 5-17 will now describe a portion of a process flow for fabricating a semiconductor device 300 including a three-dimensional stacked vertical FET architecture, such as the device 200 described above with reference to FIGS. 2-4. In one embodiment, the bottom FETs include nFETS and the top FETS include pFETS.

With reference to FIGS. 5-7, FIG. 5 provides a top-down view of the device 300, FIG. 6 provides a cross-sectional view of the device 300 shown in FIG. 6 through line C-C', and FIG. 7 provides a cross-sectional view of the device 300 shown in FIG. 6 through line D-D'.

As shown, the device 300 includes a substrate 302. The substrate 302 can include any suitable substrate structure, e.g., a bulk semiconductor, a semiconductor-on-insulator (SOI) substrate, etc. In one example, the substrate 302 can include a silicon-containing material. Illustrative examples of Si-containing materials can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

The device 300 includes a plurality of top tier fin structures including top tier fins 310, cap layers 312, and liners 314 formed on the sidewalls of the top tier fins 310 and the cap layers 312. The liners 314 can include any suitable material for protecting the top fins 310 during downstream processing. The device 300 further includes a plurality of bottom tier fins 316 separated from the top tier fins 310 by isolation layers 318. The fins 310 and 316, and the isolation layers 318 can be formed from the substrate 302 using any suitable process in accordance with the embodiments described herein. For example, the fins 310 and 316, and the isolation layers 318, can be formed by etching through an SOI substrate, where the top tier fins 310 are formed from a semiconductor layer, the bottom tier fins 316 are formed from a base substrate layer, and the isolation layers 318 are formed from an insulation layers disposed between the base substrate layer and the semiconductor layer. In one embodiment, the bottom tier fins 316 can correspond to nFETs and the top tier fins 310 can correspond to pFETs. However, such an embodiment should not be considered limiting.

As further shown, the bottom tier fins 316 are formed on bottom tier source/drain epi regions 320, and an STI region 322 is disposed on the substrate 302 between the bottom tier source/drain epi regions 320. The bottom tier source/drain epi layers 320 and the STI region 322 can be formed from the substrate 302 using any suitable process in accordance with the embodiments described herein.

The device 300 further includes bottom tier gate stacks 324 formed about respective ones of the bottom fins 316, a bottom tier bottom spacer layer 326-1 and ILD layer 308, similar to the spacer layer 228 and ILD layer 240 described above with reference to FIGS. 2-4. In one embodiment, the bottom tier gate stacks 324 correspond to nFET gates. The bottom tier gate stacks 324 can be formed using any suitable process in accordance with the embodiments described herein. For example, the bottom tier gate stacks 324 can be formed by depositing gate stack material including gate dielectrics and gate conductors (e.g., high-k dielectric material and a WFM), forming the ILD layer 322, and etching the exposed gate stack material. A bottom tier top spacer layer 326-2 can then be formed after the formation of the bottom tier gate stacks 324.

The device 300 further includes bottom tier top source/drain epi regions 328 formed about respective ones of the bottom fins 316. A drive-in anneal process can be performed to form junctions.

The device 300 further includes sacrificial layers 330-1 and 330-2 for source/drain contacts. The sacrificial layers 330-1 and 330-2 can be formed by forming a sacrificial fill, forming respective mask layers, and etching the exposed portions of the sacrificial layers 330-1 and 330-2. The sacrificial layers 330-1 and 330-2 can include any suitable material in accordance with the embodiments described herein. For example, the sacrificial layers 330-1 and 330-2 can include, e.g., an oxide material.

Figure 9:
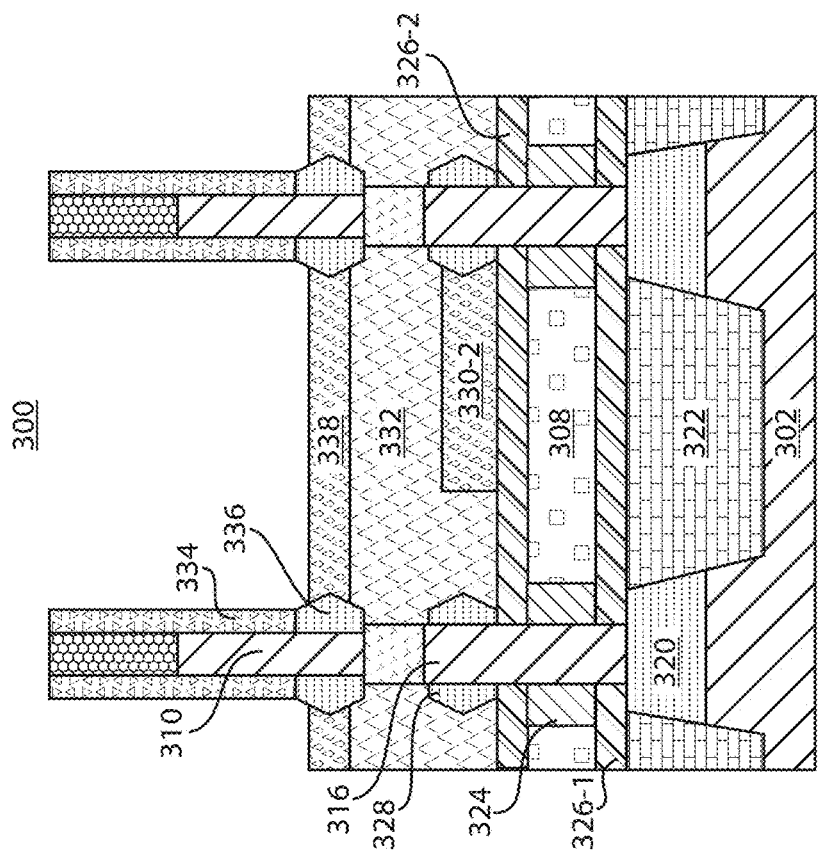
FIG. 9 is another cross-sectional view of the formation of bottom source/drain regions in the top tier of the semiconductor device during the fabrication of the semiconductor device, in accordance with an embodiment of the present invention.
Figure 8:
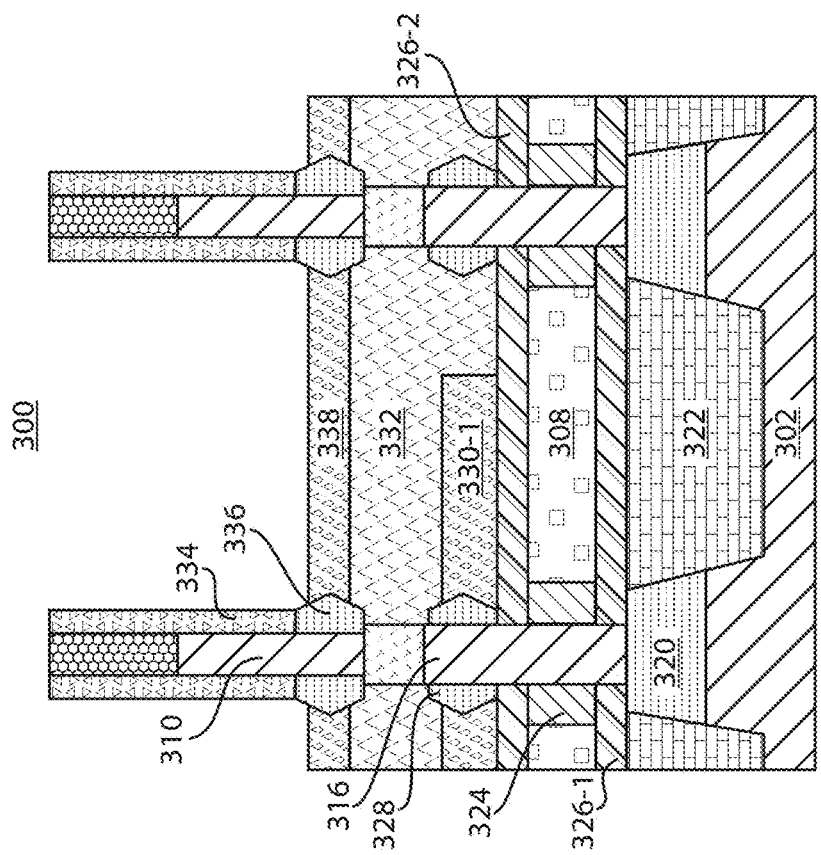
FIG. 8 is a cross-sectional view of the formation of bottom source/drain regions in the top tier of the semiconductor device during the fabrication of the semiconductor device, in accordance with an embodiment of the present invention.

With reference to FIGS. 8 and 9, an insulator layer 332 providing N-P isolation is formed. The insulator layer 332 can include any suitable material in accordance with the embodiments described herein (e.g., a nitride material). As further shown, the liners 314 are removed, second liners 334 are formed, and top tier bottom source/drain epi regions 336 are formed about respective ones of the top fins 310. The top tier bottom source/drain epi regions 336 can be formed using any suitable process in accordance with the embodiments described herein. For example, the top tier bottom source/drain epi regions 336 can be formed by removing the liners 314 (shown in FIGS. 6 and 7), forming a sacrificial dielectric layer (not shown) on the insulator layer 332, forming the second liners 334 on the dielectric layer, removing the sacrificial dielectric layer, and forming the top tier bottom source/drain epi regions 336 on the insulator layer 332 underneath the second liners 334 adjacent to the top fins 310. Then, liner 338 can be formed.

Figure 11:
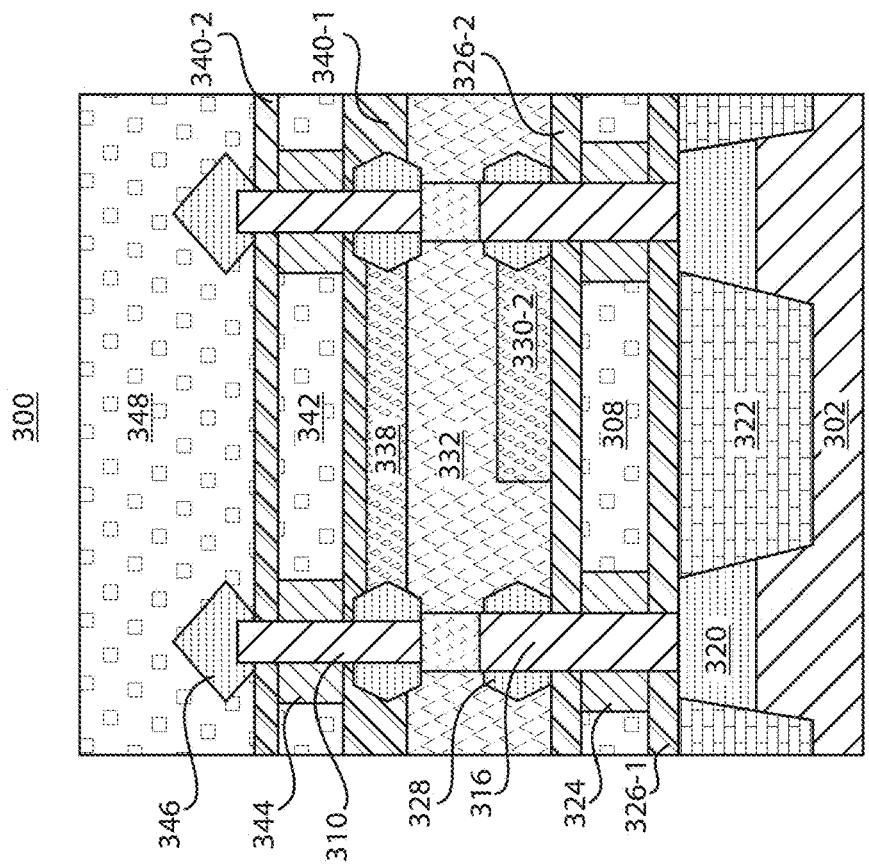
FIG. 11 is another cross-sectional view of the formation of top transistors and an interlayer dielectric (ILD) layer during the fabrication of the semiconductor device, in accordance with another embodiment of the present invention.
Figure 10:
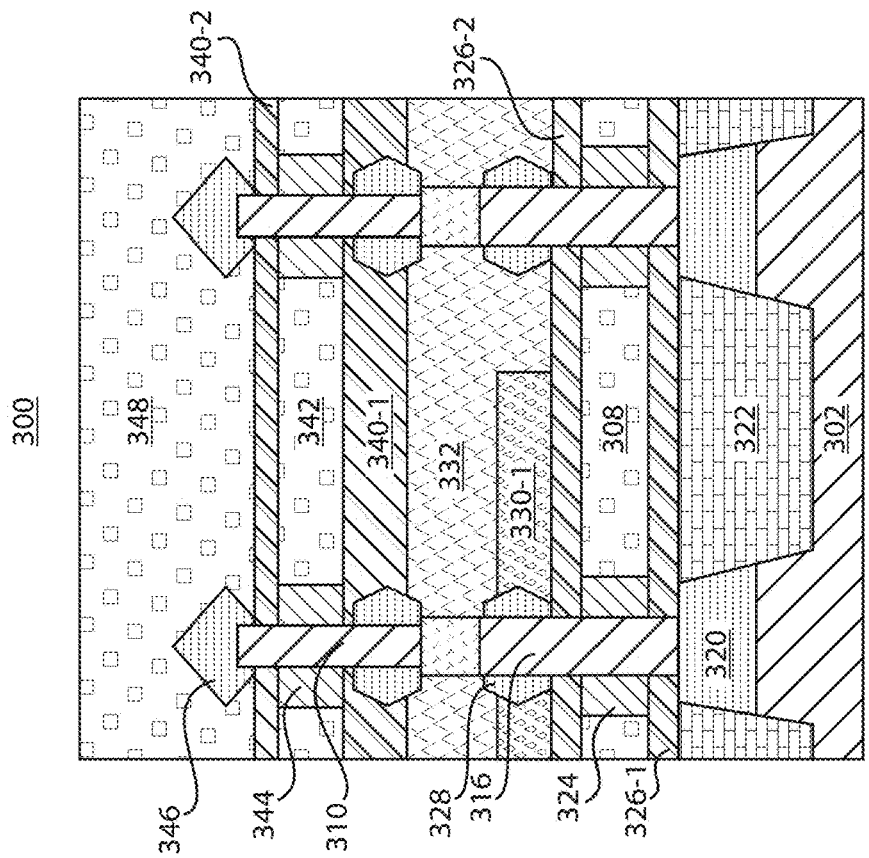
FIG. 10 is a cross-sectional view of the formation of top transistors and an interlayer dielectric (ILD) layer during the fabrication of the semiconductor device, in accordance with another embodiment of the present invention.

With reference to FIGS. 10 and 11, portions of the liner 338 are removed, and a top tier bottom spacer 340-1, an ILD layer 342, top tier gate stacks 344, a top tier top spacer 340-2, top tier top source/drain regions 346, and an ILD layer 348 are formed.

Figure 13:
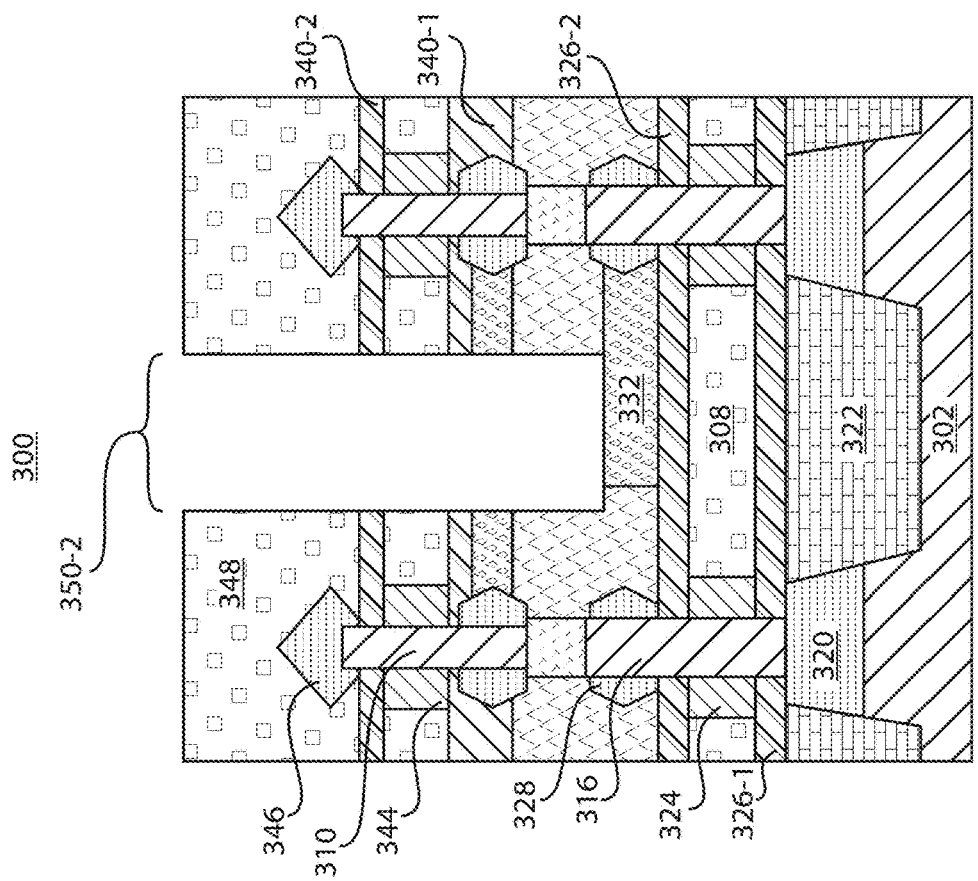
FIG. 13 is another cross-sectional view of etching performed to expose the sacrificial layers during the fabrication of the semiconductor device, in accordance with another embodiment of the present invention.
Figure 12:
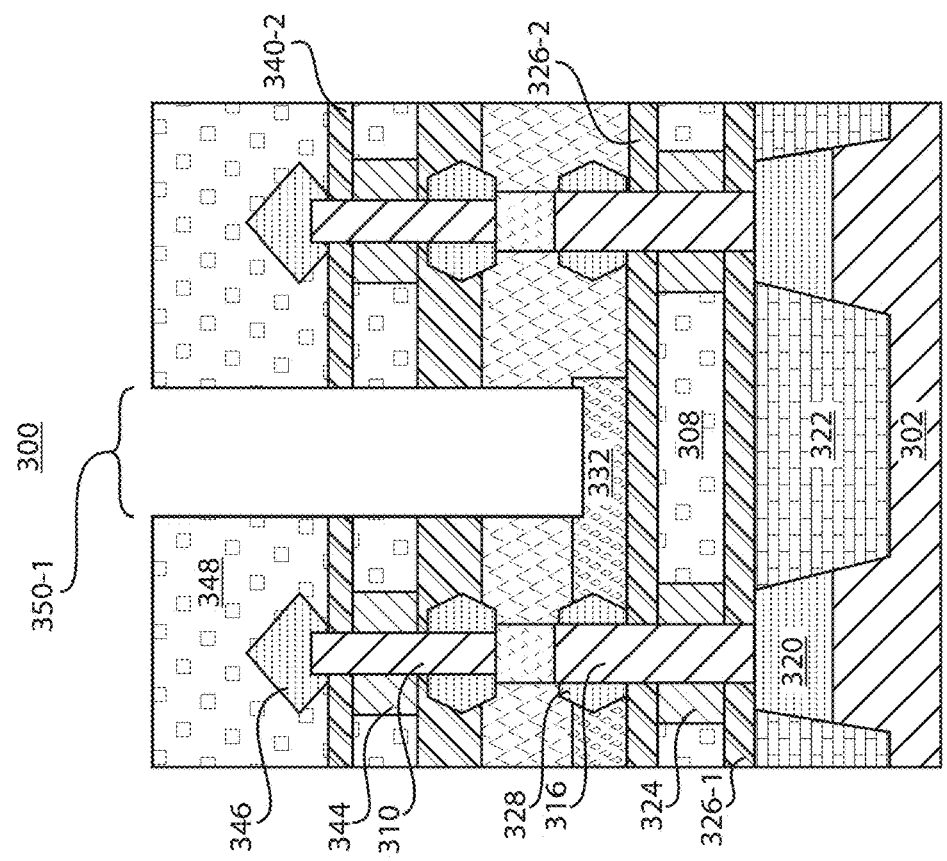
FIG. 12 is a cross-sectional view of etching performed to expose the sacrificial layers during the fabrication of the semiconductor device, in accordance with another embodiment of the present invention.

With reference to FIGS. 12 and 13, openings 350-1 and 350-2 are formed to the liners 330-1 and 330-2, respectively. Any suitable etch process can be used to form the openings 350-1 and 350-2 in accordance with the embodiments described herein (e.g., reactive-ion etch (RIE)).

Figure 15:
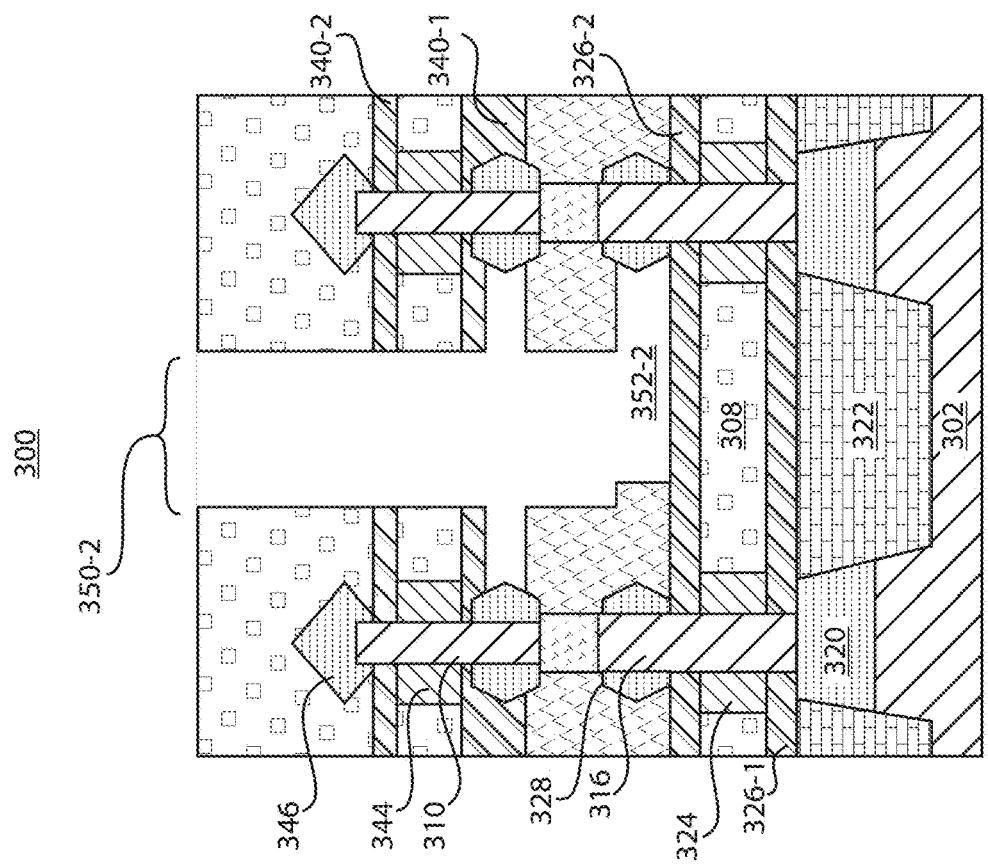
FIG. 15 is another cross-sectional view of the removal of the sacrificial layers to form cross-couple openings during the fabrication of the semiconductor device, in accordance with another embodiment of the present invention.
Figure 14:
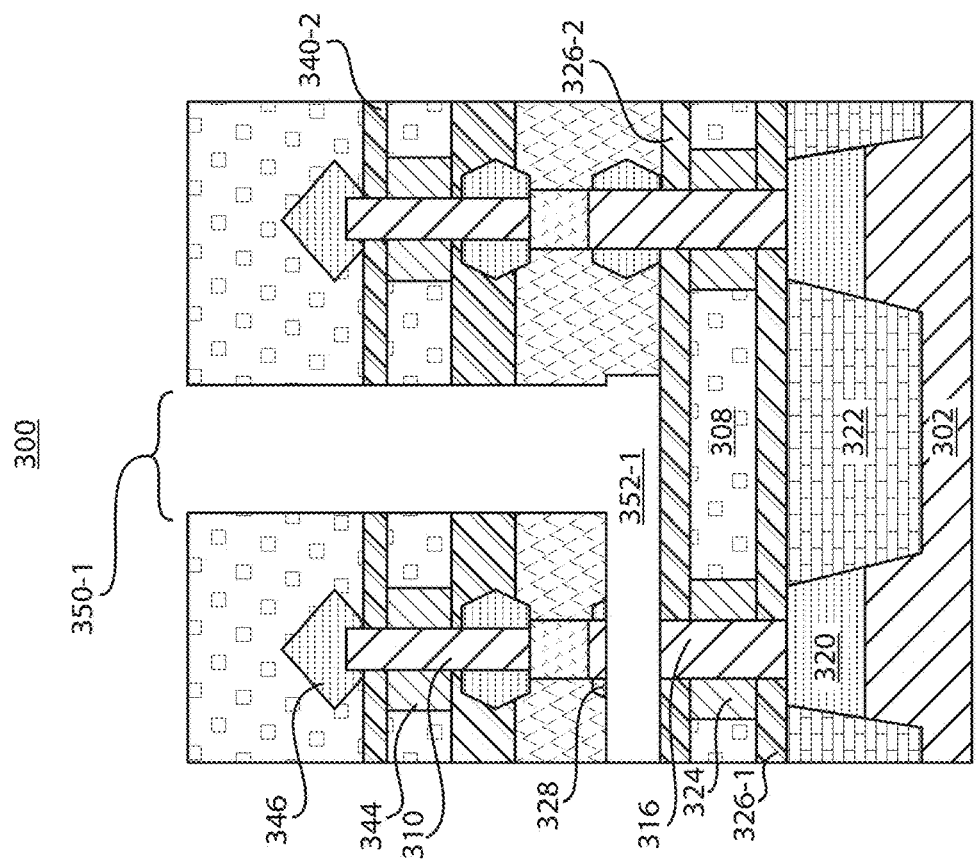
FIG. 14 is a cross-sectional view of the removal of the sacrificial layers to form cross-couple openings during the fabrication of the semiconductor device, in accordance with another embodiment of the present invention.

With reference to FIGS. 14 and 15, the liners 330-1, 330-2 and 338 are removed to form voids 352-1 and 352-2. Any suitable process can be used to remove the liners 330-1, 330-2 and 338 in accordance with the embodiments described herein.

Figure 17:
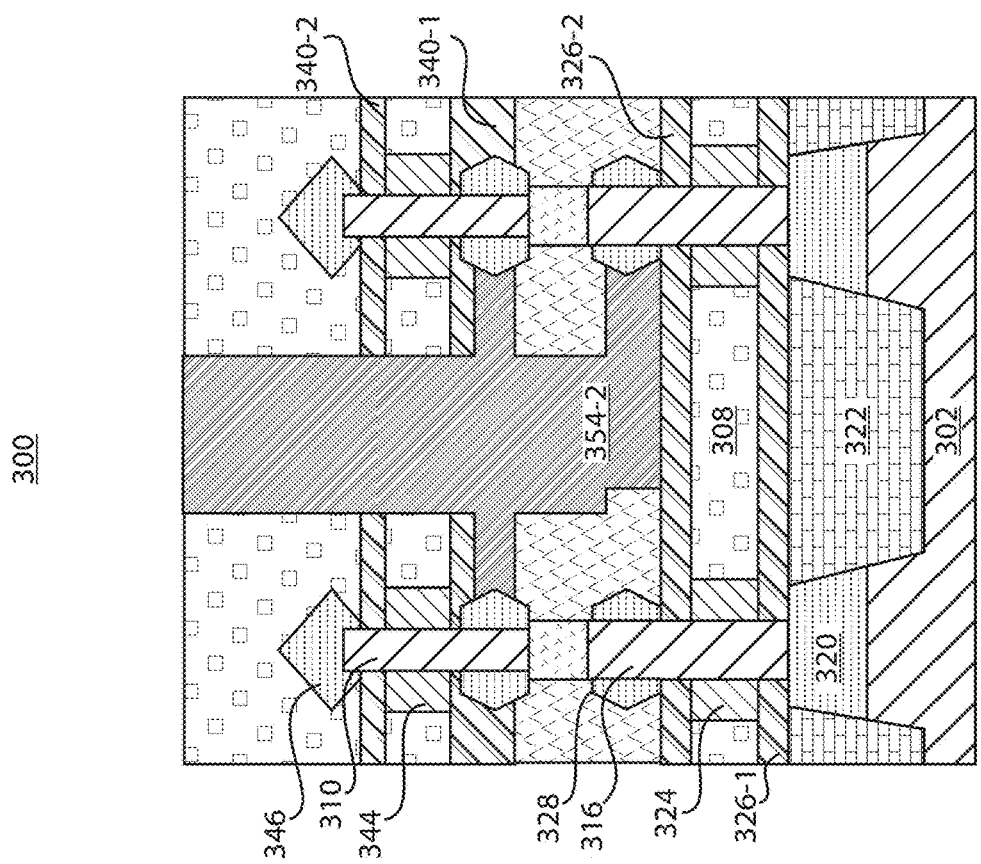
FIG. 17 is another cross-sectional view of the formation of conductive material in the cross-couple openings to form a cross-coupling during the fabrication of the semiconductor device, in accordance with an embodiment of the present invention.
Figure 16:
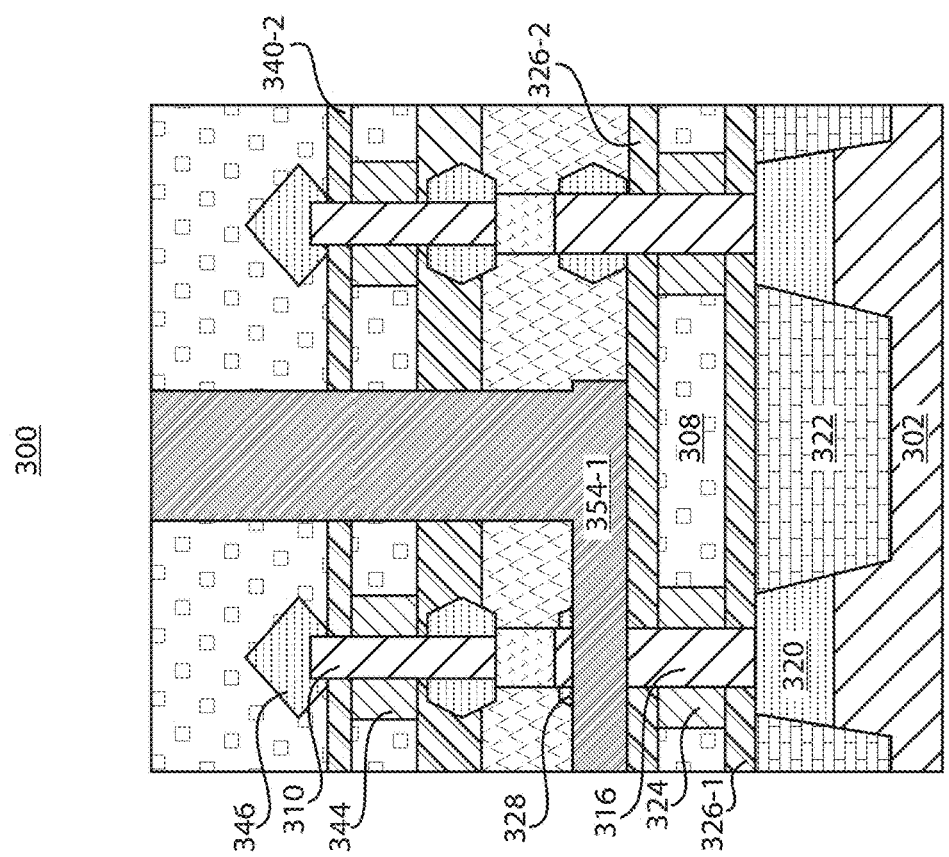
FIG. 16 is a cross-sectional view of the formation of conductive material in the cross-couple openings to form a cross-coupling during the fabrication of the semiconductor device, in accordance with another embodiment of the present invention.

With reference to FIGS. 16 and 17, the voids 352-1 and 352-2 are filled with a conductive material to form contacts 354-1 and 354-2, respectively. Examples of suitable conductive materials that can be used to form the contacts 354-1 and 354-2 include, but are not limited to, Cu, W, Ru, Co, Al, etc. The contacts 354-1 and 354-2 correspond to cross-couplings.

Figure 18:
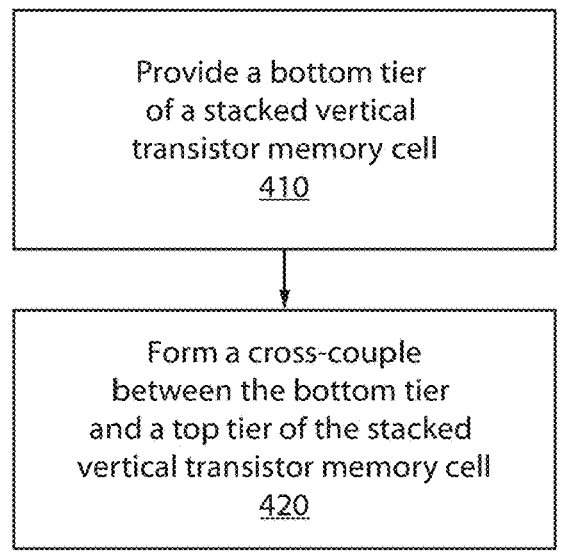
FIG. 18 is a block/flow diagram illustrating a system/method for fabricating a semiconductor device, in accordance with another embodiment of the present invention.

With reference to FIG. 18, a block/flow diagram is shown illustrating a system/method 400 for fabricating a semiconductor device including a stacked vertical transistor memory cell, in accordance with an embodiment.

At block 410, a bottom tier of a stacked vertical transistor memory cell is provided. The bottom tier can include a plurality of bottom vertical transistors having a merged top source/drain. The plurality of bottom vertical transistors can include first and second non-floating transistors and first and second floating transistors. The floating transistors can have at least one terminal being electrically disconnected from other transistors of the stacked vertical transistor memory cell.

At block 420, a cross-coupling between the bottom tier and a top tier of the stacked vertical transistor memory cell is formed. The top tier can include a plurality of top vertical transistors having a merged bottom source/drain epitaxial region ("epi"). The plurality of top vertical transistors can include first, second, third and fourth top vertical transistors.

The plurality of bottom vertical transistors further includes respective bottom source/drain epis, and the plurality of top vertical transistors further includes respective top source/drain epis. The bottom source/drain epis and the top source/drain epis can be separated by dielectric layer. The bottom tier and the top tier can be separated by isolation layers.

The plurality of bottom vertical transistors can include n-type field-effect transistors (nFETs) and the plurality of top vertical transistors include p-type field-effect transistors (pFETs).

Forming the cross-coupling between the bottom tier and the top tier can include forming epi connections by the merged top source/drain epi between the first non-floating and floating transistors, and the second non-floating and floating transistors, forming epi connections by the merged bottom source/drain epi between the first and third top vertical transistors, and the second and fourth top vertical transistors, forming gate to epi connections by metal between the first non-floating and second floating transistors, and the second non-floating and first floating transistors, and forming gate to epi connections by metal between the first and second top vertical transistors, and the third and fourth top vertical transistors.

The bottom and top tiers can further include respective gate structures. Forming the cross-coupling can further include contacting the gate structures of the bottom and top tiers.

Further details regarding blocks 410 and 420 are described above with reference to FIGS. 1-17.

Having described preferred embodiments of a semiconductor device and a method of fabricating the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device comprising:
   a stacked transistor memory cell including:
   a bottom tier including a plurality of bottom transistors including at least one non-floating transistor and at least one floating transistor, the at least one floating transistor having at least one terminal being electrically disconnected from other transistors of the stacked transistor memory cell;
   a top tier including at least one top transistor; and
   a cross-coupling including epitaxial region (epi) connections and gate to epi connections between the top tier and the bottom tier.

2. The device of claim 1, wherein:
   the stacked transistor memory cell is a stacked vertical transistor memory cell;
   the plurality of bottom transistors includes a plurality of bottom vertical transistors having a merged top source/drain epi, the plurality of bottom vertical transistors including first non-floating and floating transistors, and second non-floating and floating transistors; and
   the plurality of top vertical transistors includes first, second, third and fourth top vertical transistors having a merged bottom source/drain epi.

3. The device of claim 2, wherein the cross-coupling includes:

epi connections by the merged top source/drain epi between the first non-floating and floating transistors, and the second non-floating and floating transistors;

epi connections by the merged bottom source/drain epi between the first and third top vertical transistors, and the second and fourth top vertical transistors;

gate to epi connections by metal between the first non-floating transistor and the second non-floating transistor, and the second non-floating transistor and the first floating transistor; and gate to epi connections by metal between the first and second top vertical transistors, and the third and fourth top vertical transistors.

4. The device of claim 2, wherein the plurality of bottom vertical transistors include n-type field-effect transistors (nFETs) and the plurality of top vertical transistors include p-type field-effect transistors (pFETs).

5. The device of claim 2, wherein the plurality of bottom vertical transistors further includes respective bottom source/drain epis and the plurality of top vertical transistors further includes respective top source/drain epis.

6. The device of claim 5, further comprising dielectric layers separating the bottom source/drain epis and the top source/drain epis, and isolation layers separating the bottom tier and the top tier.

7. The device of claim 1, further comprising wordline, bitline, supply voltage and ground contacts.

8. The device of claim 1, wherein the cross-coupling further contacts gate structures of the bottom and top tiers.

9. A semiconductor device comprising:
a stacked vertical transistor memory cell including:
a bottom tier including a plurality of bottom vertical transistors including n-type field-effect transistors (nFETs) having a merged top source/drain epitaxial region (epi), and gate structures, the plurality of bottom vertical transistors including first and second non-floating transistors and first and second floating transistors, wherein the first and second floating transistors have at least one terminal being electrically disconnected from other transistors of the stacked vertical transistor memory cell;
a top tier including a plurality of top vertical transistors including p-type field-effect transistors (pFETs) having a merged bottom source/drain epi, and gate structures, the plurality of top vertical transistors including first, second, third and fourth top vertical transistors; and
a cross-coupling contacting the gate structures of the bottom and top tiers, including:
epi connections by the merged top source/drain epi between the first non-floating and floating transistors, and the second non-floating and floating transistors;
epi connections by the merged bottom source/drain epi between the first and third top vertical transistors, and the second and fourth top vertical transistors;
gate to epi connections by metal between the first non-floating and second floating transistors, and the second non-floating and first floating transistors; and
gate to epi connections by metal between the first and second top vertical transistors, and the third and fourth top vertical transistors.

10. The device of claim 9, wherein the plurality of bottom vertical transistors further includes respective bottom source/drain epis and the plurality of top vertical transistors further includes respective top source/drain epis.

11. The device of claim 10, further comprising dielectric layers separating the bottom source/drain epis and the top source/drain epis, and isolation layers separating the bottom tier and the top tier.

12. The device of claim 9, further comprising wordline, bitline, supply voltage and ground contacts.

13. A method for fabricating a semiconductor device, comprising:
forming a stacked transistor memory cell including a bottom tier having a plurality of bottom transistors including at least one non-floating transistor and at least one floating transistor and a top tier having at least one top transistor, the at least one floating transistor having at least one terminal being electrically disconnected from other transistors of the stacked vertical transistor memory cell, wherein forming the stacked transistor memory cell includes:
forming a cross-coupling including epitaxial region (epi) connections and gate to epi connections between the top tier and the bottom tier.

14. The method of claim 13, wherein:
the stacked transistor memory cell is a stacked vertical transistor memory cell;
the plurality of bottom transistors includes a plurality of bottom vertical transistors having a merged top source/drain epi, the plurality of bottom vertical transistors including first non-floating and floating transistors, and second non-floating and floating transistors; and
the plurality of top vertical transistors includes first, second, third and fourth top vertical transistors having a merged bottom source/drain epi.

15. The method of claim 14, wherein forming the cross-coupling further includes:
forming epi connections by the merged top source/drain epi between the first non-floating and floating transistors, and the second non-floating and floating transistors;
forming epi connections by the merged bottom source/drain epi between the first and third top vertical transistors, and the second and fourth top vertical transistors;
forming gate to epi connections by metal between the first non-floating and second floating transistors, and the second non-floating and first floating transistors; and
forming gate to epi connections by metal between the first and second top vertical transistors, and the third and fourth top vertical transistors.

16. The method of claim 14, wherein the plurality of bottom vertical transistors include n-type field-effect transistors (nFETs) and the plurality of top vertical transistors include p-type field-effect transistors (pFETs).

17. The method of claim 14, wherein the plurality of bottom vertical transistors further includes respective bottom source/drain epis and the plurality of top vertical transistors further includes respective top source/drain epis.

18. The method of claim 17, wherein the bottom source/drain epis and the top source/drain epis are separated by dielectric layer, and wherein the bottom tier and the top tier are separated by isolation layers.

19. The method of claim 13, wherein the stacked vertical transistor device further includes wordline, bitline, supply voltage and ground contacts.

20. The method of claim 13, wherein forming the cross-coupling further includes contacting gate structures of the bottom and top tiers.

\* \* \* \* \*